United States Patent [19]

Rodot née Fumeton

[11] 4,309,239
[45] Jan. 5, 1982

[54] METHOD AND MEANS FOR MANUFACTURING MONO-CRYSTALLINE SILICON IN TAPE FORM

[75] Inventor: Huguette Rodot née Fumeton, Meudon, France

[73] Assignee: Agence Nationale de Valorisation de la Recherche, France

[21] Appl. No.: 144,574

[22] Filed: Apr. 28, 1980

[30] Foreign Application Priority Data

May 3, 1979 [FR] France .................. 79 11174

[51] Int. Cl.$^3$ ............................................. C30B 15/06
[52] U.S. Cl. ............................ 156/601; 156/617 SP; 156/617 M; 156/DIG. 62; 156/DIG. 88; 422/109; 422/249; 156/DIG. 102; 156/DIG. 97
[58] Field of Search ............ 156/617 M, 618, 617 SP, 156/DIG. 88, DIG. 80, DIG. 89, DIG. 97, DIG. 102, DIG. 62, 601; 148/172; 422/249, 246, 109

[56] References Cited

FOREIGN PATENT DOCUMENTS

| 2633961 | 2/1977 | Fed. Rep. of Germany ... 156/DIG. 97 |
| 2649223 | 5/1978 | Fed. Rep. of Germany ... 156/DIG. 102 |
| 2387080 | 4/1977 | France . |
| 39-23062 | 8/1963 | Japan ....................... 156/DIG. 102 |

Primary Examiner—Hiram Bernstein
Attorney, Agent, or Firm—Larson and Taylor

[57] ABSTRACT

This invention relates to a process for manufacturing monocrystalline silicon.

According to this process, the fused zone Z is formed on a cylinder (1) of polycrystalline silicon and a film (5) is "drawn" by means of a seed-plate (3). The fused zone Z is obtained by resorting to heating means, notably one or several electron guns whose beam is situated in a plane $P_2$.

By means of this process, monocrystalline silicon is manufactured in the form of tape.

16 Claims, 2 Drawing Figures

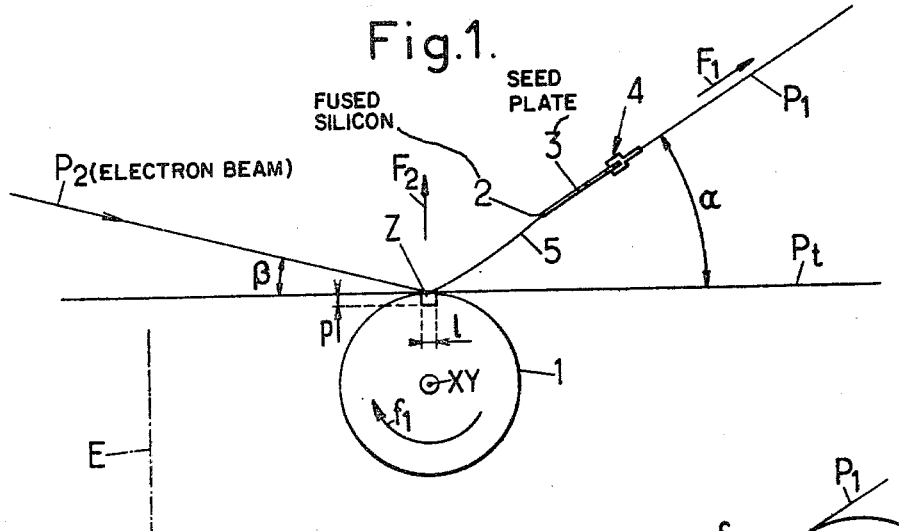
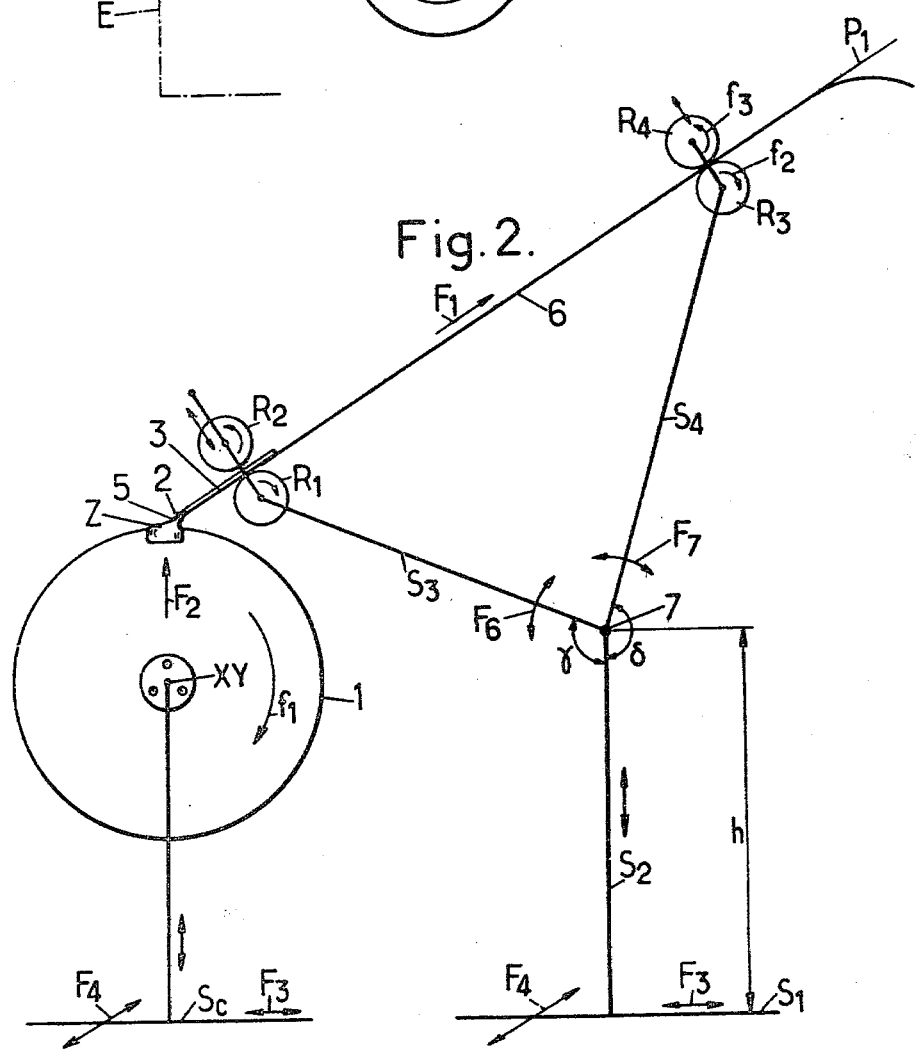

METHOD AND MEANS FOR MANUFACTURING MONO-CRYSTALLINE SILICON IN TAPE FORM

The invention relates to means, that is to say to a method, and to a device designed for the application of the method, for the manufacture of monocrystalline silicon in tape form, more generally of silicon in the form of monocrystals of large surface area and slight thickness.

Silicon monocrystals of the type concerned are used for the manufacture of solar batteries.

Methods are already known for manufacturing such silicon monocrystals in tape form. According to these methods, silicon is either deposited on a support, or is drawn in fused state through a die, or recourse is had to a molten zone moved across an already formed silicon plate.

The methods which are known have numerous and serious drawbacks such as that due to pollution of the monocrystals obtained by the support or the die, that of high operating cost and others. Moreover, they do not enable to prepare tapes of large dimensions.

It is a particular object of the invention to overcome these drawbacks and to provide a method and a device designed for its operation, suitable to enable the manufacture, at an acceptable cost price, of silicon monocrystals of good crystalline and electronic quality having a large surface for a slight thickness.

According to the above-said method:
- it is resorted to a polycrystalline silicon bar of "semiconductor" purity in the form of a revolution cylinder;
- a fused zone of a width of about 1 to about 5 mm and of a depth of about 1 to about 3 mm, is formed, under vacuum or under a neutral gas, at the surface of this cylinder and along a generatrix;
- the edge of an oriented monocrystalline silicon plate arranged parallel to the axis of the cylinder and making an angle $\alpha$ of about 30 to 45°, with the plane tangential to the cylinder, at the level of the fused zone, to enable the constituent silicon of the plate to melt, is placed in contact with the fused zone;
- the plate moved in its plane is put away from the cylinder, the plate then drawing a film of fused silicon, the speed of withdrawal or "drawing speed" being selected so that the thinning of the film before crystallization corresponds to the desired thickness for the monocrystal to be manufactured and;
- the polycrystalline silicon cylinder is imparted a rotary movement of sufficient speed to maintain a constant supply of liquid from the fused zone.

According to an advantageous embodiment of the above-said method, the fused zone is formed by resorting to a device of the scanning "electron gun" type, positioned with respect to the polycrystalline silicon cylinder so that the plane containing the electron beam forms an angle $\beta$ of at most about 15°, with the plane tangential to the cylinder, at the level of the fused zone.

According to another embodiment of the above-said method, the axis of the polycrystalline silicon cylinder is moved parallel with itself and in the direction of the plane of the electron beam to compensate for the reduction in diameter of said cylinder as a result of the removal of material due to the "drawing".

According to another advantageous embodiment of the above-said method, the fused zone is formed by resorting to a $CO_2$ laser.

According to another advantageous embodiment of the above-said method, it is resorted to "black bodies" suitably arranged to ensure any necessary cooling outside the fused zone.

According to another advantageous embodiment of the above-said method:
- the diameter of the polycrystalline silicon cylinder and its length are selected as large as possible according to the installation used;
- the rotary speed of the cylinder is selected between 0.1 and 50 rotations/minute.
- the "drawing speed" is selected between 10 and 1000 cm/h, preferably close to 500 cm/h.

According to another advantageous embodiment of the above-said method, recourse is had, to obtain tapes with a width bigger than about 3 cm, to several electron guns arranged one beside the other and whose beams which are situated in the same plane, partially overlap.

According to yet another advantageous embodiment of the above-said method, the power of the electron beam is adjusted by means of an electronic control unit cooperating with detector means for the temperature, notably of the contactless differential pyrometer type, exploring the edges of the fused zone, the adjustment of the power taking into account variations in the rotary speeds of the cylinder and of the drawing of the tape.

In accordance with the device according to the invention, for operating the above-said method, it is resorted to an enclosure adapted to operate under vacuum or filled with a neutral atmosphere and including:
- means adapted to support the polycrystalline silicon cylinder and to impart to it, under manual or automatic control, on the one hand, a rotation around its axis and, on the other hand, a translation movement parallel with its axis;
- heating means, notably at least one electron gun, adapted to form on the cylinder a fused zone parallel with a generatrix;
- means adapted to detect the temperature on the edges of the fused zone;
- means adapted to maintain a seed-plate of monocrystalline silicon in a plane, parallel with the axis of the cylinder and inclined from 30° to 45° with respect to the plane tangential to the cylinder at the level of the fused zone, to place the edge of this plate in a first stage in contact with the fused zone, then, in a second stage, to withdraw the plate from the cylinder by moving it in its plane at a speed such that the thinning of the film before crystallization corresponds to the desired thickness for the monocrystals to be manufactured;
- electronic control means cooperating with detector means for the temperature and adapted to act on the heating means so that the thermal power supplied maintains the fused zone at a constant volume taking into account variations in the speeds of rotation of the cylinder and of drawing of the tape.

According to an advantageous embodiment of the above-said device, the heating means and the means for maintaining and moving the monocrystalline silicon plate intended for the drawing of the tape to be manufactured are situated on both sides of the polycrystalline silicon cylinder and, the generatrix of the fused zone can be situated anywhere on the surface of the cylinder.

The invention is also directed to other features which are preferably used at the same time and which will be more explicitly considered below.

It will, in any case, be well understood by means of the additional description which follows and of the accompanying drawing, said additional description and drawing being given with respect to advantageous embodiments according to the invention.

FIG. 1 of this drawing is a diagrammatic view showing the manner of operation of the means applied in accordance with the invention.

FIG. 2 is a diagrammatic view of the means ensuring the maintenance and then the movement of the monocrystalline silicon plate as well as the "drawing" of the monocrystalline tape.

In order therefore to prepare a monocrystalline silicon tape, procedure is as follows or in equivalent manner.

A bar 1 of polycrystalline silicon is selected in the form of a cylinder of revolution and of "semi-conductor" purity and of length related to the width of the tape that it is desired to be manufactured.

For reasons of efficiency, bars are selected of the largest possible sizes compatible with the installation used.

In general, the bars at present available on the market are of length of about 3 to 10 cm for diameters varying from 30 to 55 mm.

As shown in FIG. 1, a zone Z of fused silicon is formed on this bar 1 whose axis is represented by XY. Said zone Z is parallel to a generatrix, hence to XY, of a width 1 from about 1 to 5 mm and of a depth p from about 1 to 3 mm.

The location of the generatrix can be selected anywhere on the bar.

The production of this fused zone is carried out inside an enclosure E under vacuum, notably in a vacuum of less than $10^{-2}$ torr, or under a neutral atmosphere.

The edge 2 of a plate 3 of oriented monocrystalline silicon is contacted with the liquid silicon of the fused zone. Said plate 3 is held by means 4 in the plane $P_1$ forming an angle $\alpha$ of about 30° to 45° with the plane $P_t$ tangential to the bar 1 at the level of the zone Z.

The width of the plate is selected to correspond to the length of the bar 1 and its thickness is comprised between about 100 and 500μ.

As soon as the constituent silicon at the edge of the plate 3 has started to melt and the temperatures are stabilized, which occurs at the end of about 180 to 300 seconds, the plate 3 is withdrawn from the cylinder by movement in its plane $P_1$ along the arrow $F_1$, thus drawing a film 5 of fused silicon.

The speed of withdrawal or "of drawing" is selected such that the thinning of the film 5 just before the point where it crystallizes because of cooling, corresponds to the thickness desired for the tape to be manufactured.

The liquid film is maintained by means of the interfacial tension (the two interfaces being: monocrystalline Si/liquid Si/polycrystalline Si) and can reach a length of about 2 to 7 mm.

Whilst the plate 3 is withdrawn from the cylinder 1, a rotary movement around XY is imparted to it, the angular speed being sufficient to keep a constant supply of liquid Si from the fused zone.

The means used for forming the fused zone Z at the surface of the cylinder 1 are advantageously constituted by at least one horizontal scanning electron gun; the power of this gun is at least 1 kW.

It is also possible to resort to a $CO_2$ laser.

The electron gun (not shown) which may be of the type sold under the name "KA6" by the LEYBOLD-HERAEUS Company, is positioned with respect to the cylinder 1 so that the plane $P_2$, containing the electron beam, forms with the plane $P_t$ an angle of at the most about 15°.

Preferably, the electron gun is positioned on the side opposite the plate 3 with respect to the cylinder 1 (FIG. 1). The direction of rotation is preferably selected so that, for the arrangement shown in FIG. 1, it is carried out along the arrow $f_1$. Heating could also be ensured by two guns situated on both sides of the cylinder 1.

Material being thus withdrawn from the bar, the diameter of the latter decreases and, as the planes $P_1$ and $P_2$ do not pivote, in order to arrange for the zone Z always to be formed at the same place, the bar 1 is subjected to a translation perpendicular to the plane $P_t$ along $F_2$ with a speed which is a function of the speed with which the diameter of said bar diminishes.

When the width of the tape to be manufactured is particularly large, it resorted to several electron guns of coincident planes $P_2$ and whose beams partially intersect, a given gun being able to ensure only the formation of a zone of a length of 3 cm at the most.

The cooling necessary outside of the zone Z is ensured by means of "black bodies", notably metal screens, cooled by water circulation, suitably arranged with respect to the portion of the bar not including the zone Z.

It is indicated that the rotary speed of the cylinder 1 is generally comprised between 0.1 and 50 rotations/minute, the "drawing" speed being selected generally between 10 and 1,000 cm/hour, preferably close to 500 cm/hour.

At the beginning of the operation, the diameter of the cylinder being bigger than subsequently, the rotary speed is relatively slow but increases with the reduction in diameter if the "drawing" speed remains constant.

To impart this rotation on the cylinder, it is resorted to a motor imparting no vibration to it, said cylinder being held by perfectly centered supports.

By way of example and for a cylinder 1 of diameter initially equal to 5.5 cm which is reduced to 1 cm by decreasing its constituent material, the speed is liable to vary from 0.2 rotation/minute at the beginning of drawing up to 2.5 rotations/minute at the end of drawing, the length of tape obtained then being of about 2 meters for a thickness of about 100μ.

From a more general point of view, the power of the electron beam is adjusted by advantageously resorting to an electronic control unit cooperating with detector means for the temperature exploring the edges of the zone Z. Advantageously these means are constituted by differential pyrometers operating "without contact". This power must be such that the volume of the fused zone remains constant.

To apply the above-said method, the device according to the invention comprises an assembly of means which will now be considered below.

It firstly comprises a parallelepipedic enclosure E which has already been considered above and which must be adapted to operate under vacuum of filled with a neutral atmosphere.

It is possible to resort, to constitute this enclosure, to enclosures marketed by the LEYBOLD-HERAEUS-SOGEV Company.

Inside this enclosure and on its base are arranged means Sc adapted to support the cylinder 1 as well as the motor, not shown, capable of imparting to the cylinder a rotation along $f_1$ around its axis, a second motor being provided to impart to the cylinder the translation movement $F_2$ perpendicular with respect to the plane $P_t$ intended to compensate its reduction in diameter because of the removal of the polycrystalline silicon. The means Sc may be moved on the base of the enclosure along the arrows $F_3$ and $F_4$.

The heating means, that is to say notably the electron gun, are implanted with respect to the enclosure on one of the side walls of the latter and the means adapted to detect the temperature on the edges of the molten zone, that is to say differential pyrometers, are placed on the walls of the enclosure above the crystallization zone.

The means with the aid of which the plate 3 is firstly held in contact with the fused zone and then withdrawn with respect to the cylinder by a movement carried out in its plane, are shown diagrammatically in FIG. 2.

From a general point of view, these means are constituted by two devices with two cylinders of axes parallel to the axis of the polycrystalline silicon bar, one of the devices being placed close to the bar and enabling, in a first stage, to maintain the plate which is gripped between its two constituent cylinders, the other device enabling, in a second stage, to draw the tape by means of a rotary movement imparted to its two constituent cylinders, the constituent cylinders of the first device being then loosened with respect to one another.

More particularly, these means comprise a stand $S_1$ which can be moved along $F_3$ and $F_4$ in a perpendicularly and parallel way to a vertical plane passing through the XY axis of the cylinder 1; a vertical support $S_2$ (notably telescopic) is fixed on the stand $S_1$. The height h of the support $S_2$ is adjustable along $F_5$. The support $S_2$ includes two support-arms $S_3$ and $S_4$ which are articulated on the upper end 7 of the support $S_2$, defining with $S_2$ a plane perpendicular to the axis XY and forming with $S_2$ respectively an angle $\gamma$ and an angle $\delta$ variable and adjustable (the positions of $S_3$ and $S_4$ can be modified along $F_6$ and $F_7$). The arm $S_3$ supports a device enabling the seed-plate 3 to be maintained and its edge to be positioned in contact with the fused zone Z; this device comprises two cylinders $R_1$ and $R_2$ of axes parallel to XY which may be brought into contact with one another and spaced from one another by an electromagnetic control, enabling $R_2$ to move away from $R_1$; this device is hence adapted to maintain the plate 3 in position or to let it pass between the rollers $R_1$ and $R_2$, $R_1$ being free to rotate on its axis when $R_2$ is withdrawn. The arm $S_4$ supports a device adapted to ensure the movement of the plate 3 in its plane by withdrawing the cylinder 1 along $F_1$. This device comprises two rollers $R_3$ and $R_4$ rotated along the arrows $f_2$ and $f_3$ by a motor (not shown) at a speed corresponding to the speed of drawing that it is desired to impart on the tape; $R_4$ is gripped against $R_3$ with a controlled force to drive the tape.

The rollers $R_1$ and $R_2$ are manufactured with a material which is non-polluting for silicon, generally selected from among silica, alumina or a refractory metal. The rollers $R_3$ and $R_4$ may be manufactured with teflon or with a non-polluting metal such as platinum.

At the beginning of drawing, to start the movement of the tape, the plate 3 is fixed (by thermocompression, welding or non-polluting glueing) on a tape 6, for example of platinum, molybdenum or tantalum; the length of this tape is sufficient (greater than the distance separating $R_1$ and $R_3$) so that, when the plate 3 is maintained between $R_1$ and $R_2$, its edge being in contact with the zone Z, the end of the tape is maintained without tension between $R_3$ and $R_4$.

During the drawing, the tape 6 is "drawn" by means of the rollers $R_3$ and $R_4$.

The angles $\gamma$ and $\delta$ are selected so that the tape 6 and the spaces comprised between the rollers $R_1$ and $R_2$, on the one hand, and $R_3$ and $R_4$, on the other hand, are contained in the plane $P_1$.

According to the recovery method desired to obtain the silicon tape (cutting up into pieces, passage through a lock or the like), it is possible to add support rollers or assemblies of two cylinders of the $R_3$-$R_4$ type serving as drive means.

The device finally comprises electronic control means, not shown, which cooperate with detector means for the temperature mentioned above and which are adapted to act on the heating means.

Below, a numerical example of the manufacture of a monocrystalline silicon tape is indicated by the application of the method according to the invention.

EXAMPLE

To manufacture a tape of 3 cm width and of 100$\mu$ thickness, it is resorted to a polycrystalline silicon cylinder, of semi-conductor quality, 3 cm long and 5.5 cm diameter which is fixed on the support Sc (FIG. 2). The cylinder is positioned with respect to the electron gun so that the plane $P_2$ of the electron beam forms an angle of 10° with the plane $P_t$ tangential to the cylinder and passing through the generator identifying the location of the fused zone.

The seed-plate 3 is 3 cm long, 2 cm wide and 200$\mu$ thick; it is welded by thermocompression to a platinum tape 6 of 200$\mu$ of thickness, 3 cm in width and 15 cm in length. It is inserted between the rollers $R_1$ and $R_2$; the free end of the tape is introduced between the rollers $R_3$ and $R_4$. The plate 3 is positioned with respect to the silicon cylinder so that its edge is situated 5 mm from the location provided for the fused zone Z. This involves the stand $S_1$, the support $S_2$ and the arms $S_3$ and $S_4$. The respective positions of these various constituent parts of the mechanism are selected so that a simple displacement of the stand $S_1$ in the direction of bar 1 places the edge 2 in contact with the fused zone Z to be created.

The vacuum enclosure is then closed and a vacuum of $10^{-3}$ to $10^{-4}$ torr is then produced.

The heating is started by raising the power of the gun gradually for a constant scanning frequency of about 10 Hz.

As soon as the material of the zone Z is melted, the cylinder is rotated at the speed of 0.2 rotation/minute. The gun power controlled by the pyrometer which is directed at a zone situated at 1 mm from the edge of the fused zone and which must be at 1400° C., enables the fused zone to be stabilized from the point of view of its volume. Fifteen minutes are then allowed to pass in order that the thermal equilibria may be established.

At a very slow speed, of about 0.5 mm per minute, the plate 3 of the fused zone is then brought up into the contact with the zone and is kept here until the liquid-seed equilibrium is established (the conditions of this equilibrium having previously been calculated and tested); in the present case, the equilibrium is established at the end of about 10 minutes (approach and contact).

The grip of the rollers $R_1$–$R_2$ is then opened, and then the drawing of the tape is set in motion by means of the rollers $R_3$ and $R_4$ at the fixed speed of 500 cm/hour; the speed of the motor ensuring the rotation of the cylinder 1 is gradually increased as a function of the decrease in the diameter of the cylinder.

In this case, no recovery device for the tape being provided, the tapes break at about 30 cm from the assembly constituted by $R_3$–$R_4$ and they are recovered in this form at the end of the crystallization; in this way 6 tapes of 30 cm were manufactured.

It is advantageous to reduce the invention to practice in microgravity or in weightlessness, by adjusting the device to special requirements, notably as regards the lightening of the device.

Because gravity is nearly nul, it is then possible:
to increase dimensions of the fused zone as well as the thickness of the crystallized tape, the dimension which can be obtained depending on superficial and internal tensions and viscosity of the fused material;
to crystallize material of weak superficial tension by this process according to the invention, then to extend the applications of the process compared to what it enables to do on the surface of the earth;
to lighten the system which maintains the tape, notably by eliminating the system of rollers $R_1$ and $R_2$ and by approaching the drawing system $R_3$–$R_4$ at about 4 to 6 cm of the cylinder 1 of material to be treated.

In the case of non volatile material, it is possible to use the special vacuum when it is clean enough.

Contrary to the method of "floating zone", the process according to the invention enables to obtain materials with desired thickness, then avoiding cutting up which can account for the loss of advantages of crystalline perfection which is obtained in microgravity.

Then, it becomes possible to crystallize materials melting at a high temperature with a weak energy and to treat an important amount of material in a restricted space with the higher security since little matter is involved in the fusion at a given time.

As a result of which and whatever the embodiments adopted, there is thus provided, for the manufacture of monocrystalline silicon tapes, a method and a device for placing it in operation whose characteristics and advantages results sufficiently from the foregoing for it to be unnecessary to dwell further on this subject.

As is itself evident and as emerges already from the foregoing the invention is no way limited to the methods of application and embodiments which have been more especially envisaged; it encompasses, on the contrary, all modifications.

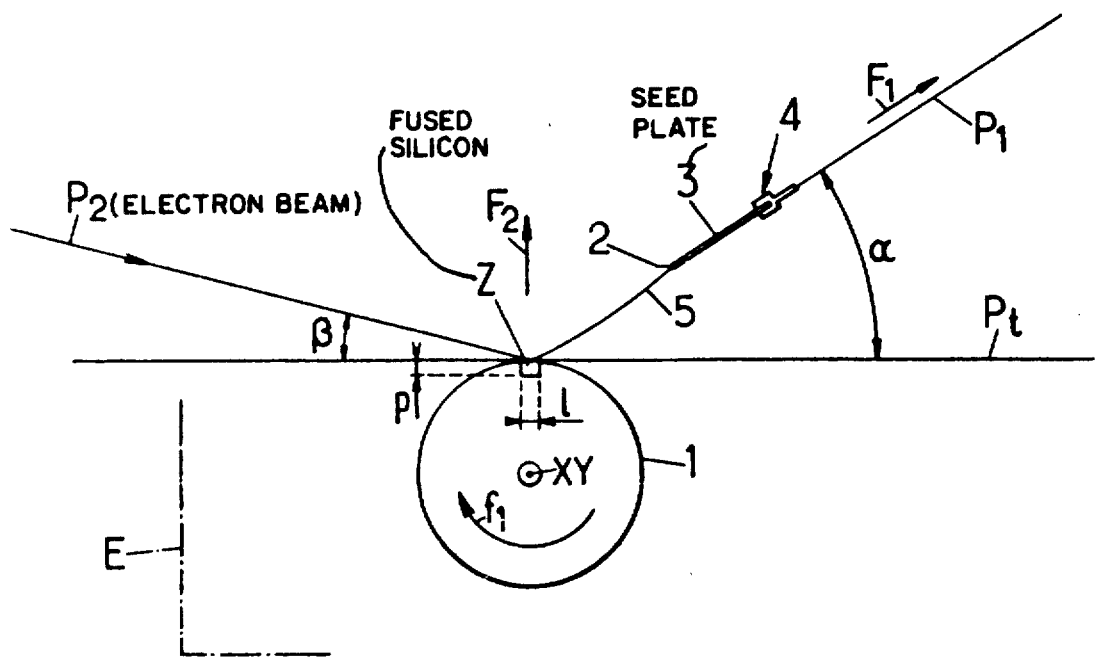

I claim:

1. In a process for manufacturing monocrystalline silicon in tape form in which recourse is had to a bar of polycrystalline silicon in the form of a cylinder of revolution, the improvement comprising:
forming at the surface of said cylinder and along a generatrix of the same, under vacuum or under neutral gas, a fused zone having a width of about 1 to about 5 mm and a depth of about 1 to about 3 mm,
contacting the edge of an oriented monocrystalline silicon plate arranged parallel to the axis of the cylinder and forming an angle $\alpha$ of about 30° to 45° with the plane tangential to the cylinder, at the level of the fused zone, with the fused zone to enable the constituent silicon of the plate to melt,
withdrawing the plate from the cylinder by moving it in its plane, the plate then drawing a film of fused silicon, the speed of withdrawal or "speed of drawing" being selected so that the thinning of the film before crystallization corresponds to the desired thickness of the monocrystal to be manufactured, and,
imparting to the cylinder of polycrystalline silicon a movement of revolution of sufficient speed to maintain a constant supply of liquid in the fused zone along the generatrix.

2. In a process according to claim 1, the improvement according to which the length of the bar or rod is equal to the width of the monocrystalline tape to be manufactured.

3. Process according to claim 1, wherein the fused zone is formed by resorting to a device of the scanning "electron gun" type, said device being positioned with respect to the polycrystalline silicon cylinder so that the plane containing the electron beam forms an angle $\beta$ of at most about 15° with the plane tangential to the cylinder, at the level of the fused zone.

4. Process according to claim 3, wherein the axis of the cylinder of polycrystalline silicon is moved parallel to itself and in the direction of the plane of the electron beam to compensate for the diminution in diameter of said cylinder resulting from the removal of material due to the "drawing".

5. Process according to claim 1, wherein the fused zone is formed by resorting to a $CO_2$ laser.

6. Process according to anyone of claims 1, 3, 4, or 5, wherein "black bodies" are suitably arranged to ensure any necessary cooling outside of the fused zone.

7. Process according to anyone of claims 1, 3, 4, or 5, wherein:
the diameter of said cylinder of polycrystalline silicon is selected between about 3 and about 5.5 cm, its length between about 3 and 10 cm;
the rotary speed of the cylinder is selected between 0.1 and 50 rotations/minute and
the "drawing" speed is selected between 10 and 1000 cm/hour.

8. Process according to claim 7 wherein said "drawing" speed is close to 500 cm/hour.

9. Process according to claim 3, wherein recourse is had, to obtain tapes of width greater than about 3 cm, to several electron guns arranged one beside the other and whose beams are situated in a same plane and partially overlap.

10. Process according to anyone of claims 3, 4, or 9, wherein the power of the electron beam is adjusted by means of an electronic control unit cooperating with detector means for detecting the temperature at the edges of the fused zone.

11. Process according to claim 10 wherein said temperature detector means comprises a pyrometer of the contact-less differential type.

12. Device for the application of the method according to claim 1, wherein recourse is had to an enclosure adapted to operate under vacuum or filled with a neutral atmosphere and comprising:
means adapted to support the polycrystalline silicon cylinder and to impart to it, on the one hand, a rotation around its axis and, on the other hand, a translation movement parallel to its axis;

heating means adapted to form on the cylinder a fused zone parallel to a generatrix;

means adapted to detect the temperature at the edge of the fused zone;

means adapted to maintain a seed-plate of monocrystalline silicon in a plane parallel to the axis of the cylinder and inclined from 30° to 45° with respect to a plane tangential to the cylinder at the level of the fused zone, to contact the edge of this plate with the fused zone, in a first stage, then, in a second stage, to withdraw the plate from the cylinder by moving it in its plane;

electronic control means cooperating with said temperature detecting means and adapted to act on the heating means to confer on the fused zone a constant volume.

13. Device according to claim 12 wherein said heating means comprises at least one electron gun.

14. Device according to claim 12 wherein the heating means and the means for maintaining and moving the monocrystalline silicon plate designed for the drawing of the tape to be manufactured are situated on both sides with respect to the cylinder of polycrystalline silicon.

15. Device according to claim 12 wherein the means for maintaining and moving the seed-plate of monocrystalline silicon are constituted by two devices with two cylinders with axes parallel to the axis of the bar of polycrystalline silicon, one of the devices being placed close to the bar and enabling, in the first stage, the maintaining of the plate which is gripped between its two constituent cylinders, the other device enabling, in a second stage, the drawing of the tape by means of a rotary movement imparted to its two constituent cylinders, the constituent cylinders of the first device being then loosened with respect to one another.

16. Process according to claim 1 which is carried out under conditions of microgravity or weightlessness.

* * * * *

UNITED STATES PATENT AND TRADEMARK OFFICE
CERTIFICATE OF CORRECTION

PATENT NO. : 4,309,239
DATED : January 5, 1982
INVENTOR(S) : Rodot, Huguette

It is certified that error appears in the above—identified patent and that said Letters Patent is hereby corrected as shown below:

The Title page should be deleted to appear as per attached Title page.

Figure 1 of the drawing should be deleted to appear as follows.

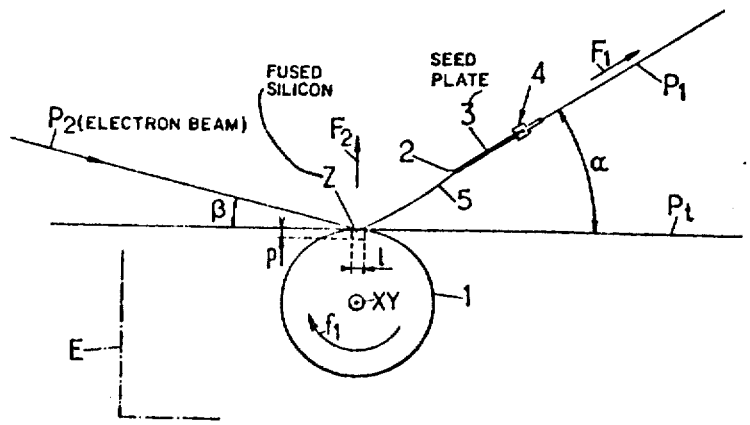

Signed and Sealed this

Twenty-ninth Day of June 1982

[SEAL]

Attest:

Attesting Officer

GERALD J. MOSSINGHOFF

Commissioner of Patents and Trademarks

United States Patent [19]
Rodot née Fumeton

[11] 4,309,239
[45] Jan. 5, 1982

[54] METHOD AND MEANS FOR MANUFACTURING MONO-CRYSTALLINE SILICON IN TAPE FORM

[75] Inventor: Huguette Rodot née Fumeton, Meudon, France

[73] Assignee: Agence Nationale de Valorisation de la Recherche, France

[21] Appl. No.: 144,574

[22] Filed: Apr. 28, 1980

[30] Foreign Application Priority Data

May 3, 1979 [FR] France ................. 79 11174

[51] Int. Cl.³ ............................. C30B 15/06
[52] U.S. Cl. .................... 156/601; 156/617 SP; 156/617 M; 156/DIG. 62; 156/DIG. 88; 422/109; 422/249; 156/DIG. 102; 156/DIG. 97
[58] Field of Search ........... 156/617 M, 618, 617 SP, 156/DIG. 88, DIG. 80, DIG. 89, DIG. 97, DIG. 102, DIG. 62, 601; 148/172; 422/249, 246, 109

[56] References Cited
FOREIGN PATENT DOCUMENTS

| 2633961 | 2/1977 | Fed. Rep. of Germany ... 156/DIG. 97 |
| 2649223 | 5/1978 | Fed. Rep. of Germany ... 156/DIG. 102 |
| 2387080 | 4/1977 | France . |
| 39-23062 | 8/1963 | Japan ........................ 156/DIG. 102 |

Primary Examiner—Hiram Bernstein
Attorney, Agent, or Firm—Larson and Taylor

[57] ABSTRACT

This invention relates to a process for manufacturing monocrystalline silicon.

According to this process, the fused zone Z is formed on a cylinder (1) of polycrystalline silicon and a film (5) is "drawn" by means of a seed-plate (3). The fused zone Z is obtained by resorting to heating means, notably one or several electron guns whose beam is situated in a plane $P_2$.

By means of this process, monocrystalline silicon is manufactured in the form of tape.

16 Claims, 2 Drawing Figures